United States Patent [19]

Bazin

[11] 4,043,848

[45] Aug. 23, 1977

[54] METHOD OF FABRICATION OF INSULATED GATE FIELD EFFECT SEMICONDUCTOR DEVICES

[75] Inventor: Bernard Bazin, Paris, France

[73] Assignee: Texas Instruments Incorporated, Dallas, Tex.

[21] Appl. No.: 265,854

[22] Filed: June 23, 1972

[30] Foreign Application Priority Data

Apr. 30, 1971 France .................................. 71.15577

[51] Int. Cl.² .......................................... H01L 21/316
[52] U.S. Cl. ...................................... 148/187; 357/23
[58] Field of Search ......................................... 148/187

[56] References Cited

U.S. PATENT DOCUMENTS

| | | | |
|---|---|---|---|
| 3,477,886 | 11/1969 | Ehlenberger | 148/187 |
| 3,534,234 | 10/1970 | Clevenger | 317/235 |
| 3,544,858 | 12/1970 | Kooi | 317/235 |
| 3,597,667 | 8/1971 | Horn | 148/187 X |

*Primary Examiner*—L. Dewayne Rutledge
*Assistant Examiner*—J. M. Davis
*Attorney, Agent, or Firm*—Harold Levine; James T. Comfort; Gary C. Honeycutt

[57] ABSTRACT

An insulated gate field effect transistor having a self-aligned gate, reduced capacitance, and lower surface step heights is fabricated with the use of a silicon nitride layer which serves first as a diffusion mask, than as an oxidation barrier, and ultimately as a gate dielectric. In an alternate embodiment, lower threshold voltages are achieved by replacing the initial gate dielectric with a thinner dielectric having a reduced surface state density.

8 Claims, 9 Drawing Figures

METHOD OF FABRICATION OF INSULATED GATE FIELD EFFECT SEMICONDUCTOR DEVICES

This invention relates to the fabrication of semiconductor devices, and more particularly to the processing of semiconductor wafers to achieve selective oxidation and thereby control oxide thickness at selected locations at the wafer surface. In a specific embodiment an insulated gate field effect transistor is fabricated with the use of a silicon nitride layer which serves first as a diffusion mask, then as an oxidation barrier, and ultimately as a gate dielectric.

In the fabrication of an insulated gate field effect transistor a primary concern is to obtain a precise alignment of the gate dielectric and the gate electrode with the gate region of the semiconductor body. Any misalignment is costly since the resulting asymmetry adversely affects device reliability and can sharply reduce the yield of devices which meet design characteristics. Recent developments have included various techniques for self-alignment of the gate structure, but have not sufficiently minimized overlap capacitance and surface step heights.

If the gate dielectric and gate electrode structure overlap the source and drain areas, a parasitic capacitor is introduced, which seriously limits the frequency characteristics of the device. Increased insulator thickness adjacent the gate dielectric does tend to reduce capacitance; however, the increased step heights thereby introduced on the surface of the slice can severely reduce yields obtained during the subsequent metallization step.

Accordingly, it is a primary object of the present invention to provide improved techniques for use in processing semiconductor wafers. More particularly, it is an object of the invention to provide a method having specific utility in the fabrication of an insulated gate field effect transistor.

It is a further object of the invention to reduce the surface step heights normally characteristic of semiconductor wafers having insulation layers with relatively thin and relatively thick portions located on adjacent device regions. It is also an object of the invention to provide a method for the fabrication of an insulated gate field effect transistor having reduced overlap capacitance and a substantially increased frequency range.

One aspect of the invention features a method for selectively controlling the thickness of a least portion of a silicon oxide layer on a silicon body, including the step of forming a silicon nitride layer on said portion of the silicon oxide layer, and exposing the structure to an oxidizing atmosphere whereby the silicon is oxidized to form silicon oxide of increased thickness at locations not covered by nitride, while those regions protected by nitride do not become significantly thicker. The key feature of this embodiment is the ability of silicon nitride to function as a barrier to an oxidizing atmosphere, including oxygen or steam, for example.

Another aspect of the invention features an improved methodfor selective diffusion and selective oxidation which includes the steps of forming an adherent film of silicon oxide on a silicon body, said film having openings therein to expose selected surface areas of the silicon body. An adherent film of silicon nitride is also formed on selected portions of the body. The nitride is formed either in direct contact with the silicon surface or, alternatively, on some portion of the silicon oxide film. The structure is then exposed to a conductivity-type-determining impurity in an oxidizing atmosphere, whereby the impurity is selectively diffused into the exposed surface areas of said body, concurrently with a selective oxidation of the silicon at surfaces not protected by the nitride. The combination of selective diffusion and selective oxidation is achievable concurrently as a single operation or, alternatively, as a sequential operation wherein the selective diffusion is at least partially completed prior to the step of exposing the body to an oxidizing atmosphere. That is, a predeposition of the conductivity-type-determining impurity is advantageously accomplished in a non-oxidizing atmosphere, followed by a drive-in step conducted in an oxidizing atmosphere. In such an embodiment the nitride layer serves both as a diffusion mask and as an oxidation barrier.

The invention is embodied in a process for the fabrication of an insulated gate field effect device beginning with the steps of forming an adherent, apertured mask of silicon oxide on a monocrystalline silicon body of one conductivity type, and providing the mask with an oxygen-impermeable film such as silicon nitride, for example, on selected areas thereof. The apertured areas of the silicon oxide mask define the locations of the source and drain regions to be formed by selective diffusion; whereas the oxygen impermeable film defines the location of the gate region and the locations where ohmic contacts are to be made to the silicon body.

The masked semiconductor body is then exposed to a suitable dopant for inducing the opposite conductivity type in the apertured surface regions of the semiconductor. Generally, this step consists of a predeposition of dopant to be driven in subsequently. The masked semiconductor having the dopant predeposited thereon is exposed to an oxidizing atmosphere at diffusion conditions whereby the dopant is driven deeper into the silicon, and the silicon surface is selectively oxidized at locations not protected by the oxygen-impermeable film. Both mask layers are selectively removed from the ohmic contact locations, after which the structure is provided with a thin conductor film to form a gate electrode on the remaining oxygen-impermeable film, in combination with source and drain electrodes extending through the thick oxide to contact the source and drain regions.

In the above sequence the steps of oxygen-impermeable film, together with the oxide underneath, is retained as the gate dielectric. The resulting device is characterized by a threshold voltage of 3.5 - 5.5 volts. Such a threshold is substantially higher than one might expect because of the presence of free oxygen atoms which migrate to the gate oxide during the oxidation and drive-in stage of the operation. Accordingly, in an alternate embodiment, a lower threshold voltage, in the range of 1.8 - 2.5 volts, is provided by removing the initial gate dielectric after diffusion and oxidation, and then providing a new gate dielectric having a reduced surface state density.

Figure 1:
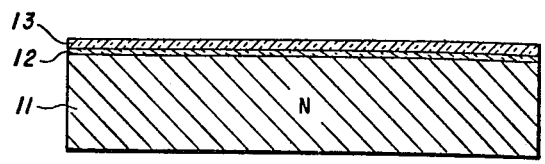
FIGS. 1-4 are enlarged, cross-sectional views of a monocrystalline silicon wafer illustrating various intermediate stages in the fabrication of an insulated gate field effect transistor having a relatively high threshold voltage.
Figure 2:
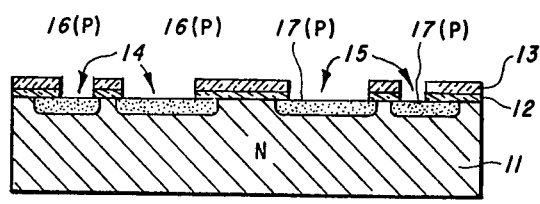

As shown in FIG. 1, the process begins with the selection of a monocrystalline silicon wafer 11 having n-type conductivity provided by doping with phosphorus or antimony to a concentration which provides a resistivity generally in the range of 1 - 10 ohm-centimeters. Wafer 11 is provided with silicon dioxide layer 12 and silicon nitride layer 13, using known techniques. For example, the oxide layer is provided by thermal oxidation at a temperature of about 1000° C for a time sufficient to provide oxide thickness of preferably 400 - 600 angstroms. The silicon nitride layer is preferably 600 - 800 angstroms thick and is generally deposited by the reaction of silane with ammonia at a temperature of 700 - 900° C. In FIG. 2, wafer 11 is shown after the patterning of layers 12 and 13 to provide apertures 14 and 15 therein which define the location of source and drain regions to be formed within wafer 11 by selective diffusion. The portions of layers 12 and 13 surrounded by apertures 14 and 15 define the positions where ohmic contacts to the semiconductor are to be made. A preferred technique for patterning layers 12 and 13 includes the deposition of a chromium or molybdenum mask followed by the use of an aqueous HF etch solution at a concentration of 0.2 - 2.0 percent, at 80° C. Etching at these conditions is advantageous since the etch rates of the oxide and nitride are substantially equal, thereby avoiding any significant shelving or undercutting.

Boron dopant is then predeposited at elevated temperatures to a surface concentration of at least about 5 ohms per square and preferably 10 - 50 ohms per square, forming surface regions 16 and 17 of p-type conductivity.

Figure 3:
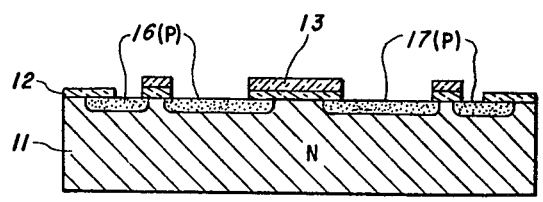

As shown in FIG. 3, portions of nitride mask 13 are then selectively removed, leaving only that portion which defines the gate dielectric region and the ohmic contact locations. The selective removal of the nitride is achieved by masking with KMER, for example, and contacting the nitride with a dilute HF etch as noted above.

Figure 4:
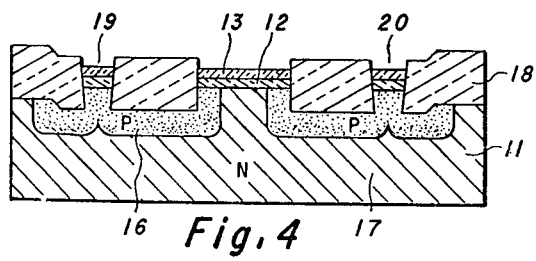

As shown in FIG. 4, the wafer is then subjected to diffusion and oxidation conditions whereby the dopant of regions 16 and 17 is driven deeper into the semiconductor, concurrently with the selective growth of silicon oxide at all surface locations not protected by the remaining portions of nitride layer 13. Since the boron dopant diffuses laterally at a rate which substantially exceeds the rate of lateral oxide growth, region 16 "spreads" to provide a suitable contact area 19, while region 17 spreads to provide contact area 20, below oxide 12. The thick oxide is grown to a thickness of at least one-half micron and preferably at least 1.0 micron. In a specific embodiment the gate dielectric including both oxide and nitride is 0.12 microns thick while the adjacent oxide is 1.2 microns thick. Since the thermal oxide replaces a silicon layer slightly less than half the oxide thickness, a surface step height of 0.54 microns between the gate dielectric and the adjacent oxide is provided, which is one-half the step height typically characteristic of the prior art. Contact areas 19 and 20 are then opened by selective etching to remove the nitride and thin oxide to provide access for ohmic contact to the source and drain regions, respectively.

Figure 5:
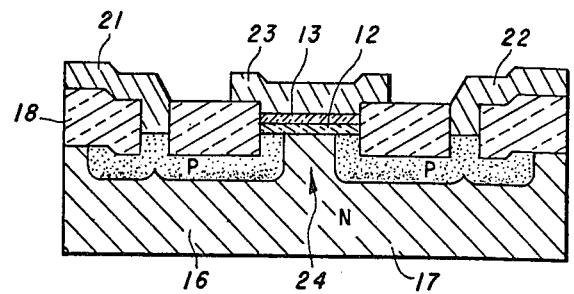
FIG. 5 is an enlarged, cross-sectional view of the device completed in accordance with the process of FIGS. 1-4.

As shown in FIG. 5, the completed device includes source and drain contacts 21 and 22 in combination with gate electrode 23. The embodiment shown is a p-channel, enhancement moe, insulated gate field effect transistor. It will be apparent that other embodiments, including the p-channel depletion mode, the n-channel enhancement mode and the n-channel depletion mode devices are within the scope of the invention. It is particularly significant that the channel region 24 of the semiconductor body is located in a "mesa" due to the conversion of adjacent silicon to oxide. As a result, low overlap capacitance is provided in combination with reduced surface step heights.

Figure 6:
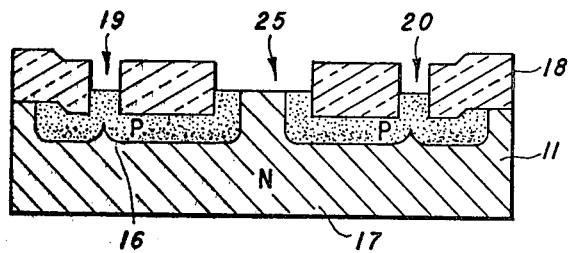
FIGS. 6-8 are enlarged, cross-sectional views of a monocrystalline silicon wafer illustrating an alternate sequence of steps, in combination with FIGS. 1-4, for the fabrication of an alternate embodiment of the invention.
Figure 7:
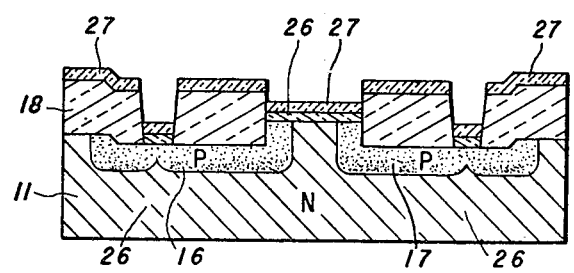
Figure 8:
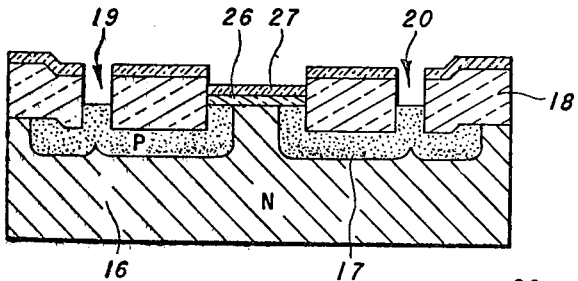

In order to provide lower threshold voltages, an alternate embodiment is provided which invloves a further processing of the structure illustrated in FIG. 4 to remove the initial gate dielectric, forming window 25 as illustrated in FIG. 6. Such a removal is accomplished, for example, by a 7-minute immersion of the wafer in 0.5% aqueous HF at 80° C. A new gate dielectric is then provided by thermal oxidation, for example, to provide a silicon oxide layer 26 having a thickness of 400 - 600 angstroms which is then covered by silicon nitride deposition of layer 27 to a thickness of 600 - 800 angstroms. Contact areas 19 and 20 are reopened as shown in FIG. 8 followed by conductor deposition and patterning to provide electrodes 28, 29 and 30 as shown in FIG. 9, whereby a p-channel enhancement made insulated gate field effect transistor is completed having a threshold voltage in the range of 1.8 - 2.5 volts, in addition to the features noted for the embodiment of FIG. 5

Figure 9:
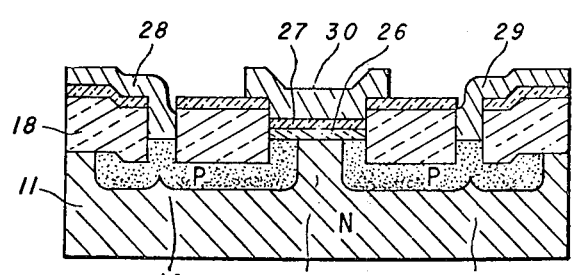
FIG. 9 is an enlarged, cross-sectional view of a field effect transistor completed in accordance with the alternate process embodiment of FIGS. 6-8, having a relatively low threshold voltage.

Although aluminum is commonly used as the conductor film in forming electrodes 21, 22, and 23 of the embodiment of FIG. 5, and electrodes 28, 29 and 30 of the embodiment of FIG. 9, it is sometimes preferred to deposit a heavily doped silicon film to form the electrodes and associated interconnection patterns. The silicon is deposited by well-known prior techniques, and is predominantly polycrystalline, as will be readily understood by those skilled in the art. Such use of silicon minimizes any leakage currents that may otherwise be experienced at the ohmic contact areas.

In the illustrated embodiments boron diffuses laterally (FIG. 4) to provide a continuous p-type region 16 at the ohmic contact location 19, and a continuous p-type region 17 at the ohmic contact location 20. Other embodiments of the invention include contact locations having a width greater than twice the lateral diffusion distance, in which case the center of each contact location remains high-resistivity n-type material, leading to the formation of a Schottky-barrier surrounded by an ohmic contact. If desired, the barrier is easily converted, after metallization with aluminum, by sintering at a temperature sufficiently high to cause aluminum-doping of the semiconductor.

A primary advantage of each embodiment is the provision of contact holes of only about one-half the depth of prior devices. As a result metallization yields are improved.

I claim:

1. A process for the fabrication of an insulated gate field effect transistor comprising the steps of:
    forming an adherent, apertured mask of silicon oxide on a monocrystalline silicon body of one conductivity type, said mask having an oxygen-impermeable film on selected areas thereof including a gate area and areas where ohmic contacts are to be formed;

exposing the masked body to a suitable dopant for inducing the opposite conductivity type in the apertured surface regions of said body;

exposing the masked body to an oxidizing atmosphere, whereby the silicon surface is selectively oxidized at locations not protected by said oxygen-impermeable film;

selectively removing the oxide and oxygen-impermeable films from the ohmic contact areas; and depositing and patterning a conductor film on the structure to form a gate electrode on said remaining oxygen-impermeable film, in combination with source and drain electrodes extending through the oxide in contact with said regions of opposite conductivity type.

2. A process as defined by claim 1 wherein said oxygen-impermeable film comprises silicon nitride.

3. A process as defined by claim 1 wherein said silicon is on n-type conductivity and said dopant is boron.

4. A method as defined by claim 1 wherein said silicon is of p-type conductivity and said dopant is phosphorus or antimony.

5. A method as defined by claim 1 wherein said conductor film is silicon.

6. A process for the fabrication of an insulated gate field effect transistor comprising the steps of:

forming an adherent, apertured diffusion mask of silicon oxide and silicon nitride on a monocrystalline silicon body of one conductivity type, including a gate location and locations where ohmic contacts are to be made;

exposing the masked body to a suitable dopant at elevated temperature for a time sufficient to convert the apertured surface regions of the body to opposite conductivity type;

removing the nitride from selected portions of said diffusion mask;

exposing the surface to oxidation conditions for a time sufficient to complete the diffusion of said dopant into a subsurface region of said body, and concurrently to form a relatively thick silicon oxide pattern on the body surface except for regions where the nitride remains;

selectively etching to remove the nitride and oxide at ohmic contact locations to expose a portion of the diffused regions; and forming a conductor pattern extending in contact with the diffused regions, in combination with a gate electrode on the remaining nitride.

7. A process as defined by claim 6 wherein the oxide layer beneath the nitride layer has a thickness of 0.05 – 0.25 microns and said relatively thick silicon oxide pattern has a thickness of 0.5 – 2.0 microns.

8. A process as defined by claim 6 wherein said silicon nitride has a thickness of at least 600 angstroms.

* * * * *